United States Patent
Taniwaki et al.

(10) Patent No.: US 7,830,715 B2
(45) Date of Patent: Nov. 9, 2010

(54) SEMICONDUCTOR DEVICE

(75) Inventors: Kazuhiro Taniwaki, Yokkaichi (JP); Toshifumi Minami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 280 days.

(21) Appl. No.: 12/132,219

(22) Filed: Jun. 3, 2008

(65) Prior Publication Data

US 2008/0298125 A1    Dec. 4, 2008

(30) Foreign Application Priority Data

Jun. 4, 2007  (JP)  ............................. 2007-148209

(51) Int. Cl.
*G11C 11/34*  (2006.01)
*G11C 16/04*  (2006.01)
(52) U.S. Cl. ............................. 365/185.17; 365/185.23
(58) Field of Classification Search ............ 365/185.17, 365/185.23
See application file for complete search history.

(56) References Cited

U.S. PATENT DOCUMENTS

| 7,035,143 | B2* | 4/2006 | Lee ........................ 365/185.17 |
| 7,095,656 | B2* | 8/2006 | Lee ........................ 365/185.29 |
| 7,119,413 | B2 | 10/2006 | Kutsukake | |
| 7,161,837 | B2* | 1/2007 | Park ....................... 365/185.23 |
| 7,272,042 | B2* | 9/2007 | Nakai ..................... 365/185.17 |

FOREIGN PATENT DOCUMENTS

JP        2006-59978       3/2006

* cited by examiner

*Primary Examiner*—Anh Phung
(74) *Attorney, Agent, or Firm*—Oblon, Spivak, McClelland, Maier & Neustadt, L.L.P.

(57) ABSTRACT

A semiconductor device includes a semiconductor substrate including an element region which is surrounded by an element isolation insulation layer, a transistor including a gate electrode which is provided on the element region, and a source region and a drain region which are provided in the first element region, a first auxiliary wiring layer and a second auxiliary wiring layer which extend in a channel length direction and are provided on the element isolation insulation layer such that the first transistor is interposed between the first auxiliary wiring layer and the second auxiliary wiring layer, and a control circuit which sets, while the first transistor is in an ON state, the first auxiliary wiring layer and the second auxiliary wiring layer at a first voltage of the same polarity as a gate voltage of the first transistor that is in the ON state.

9 Claims, 8 Drawing Sheets

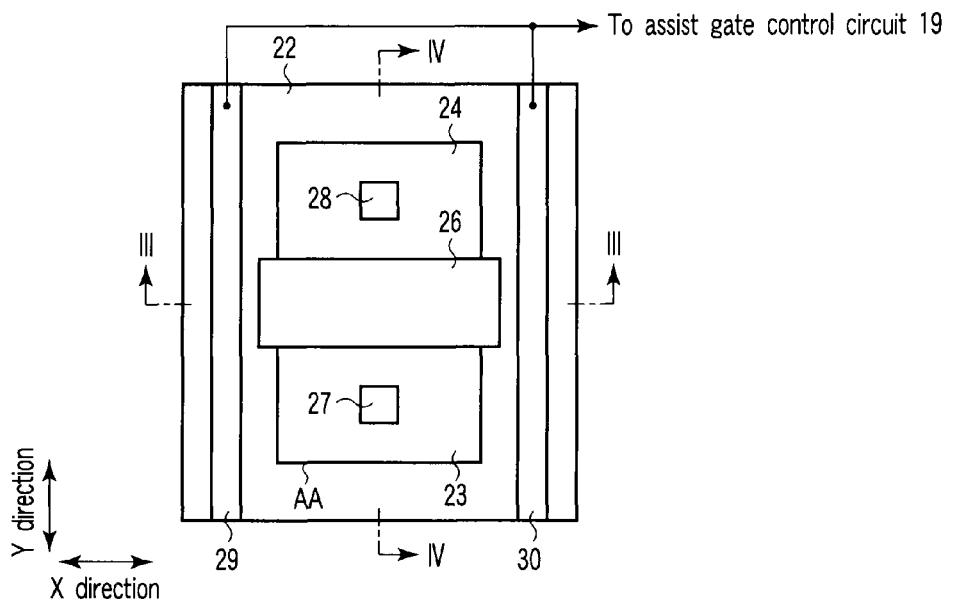
F I G. 2
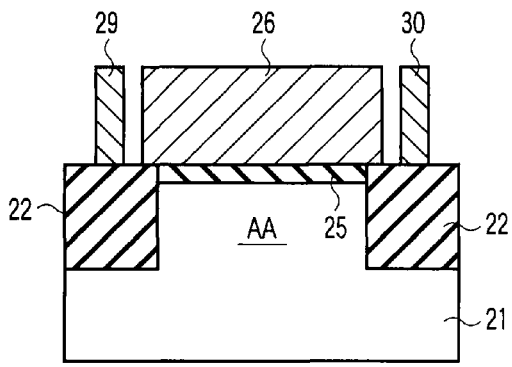
F I G. 3
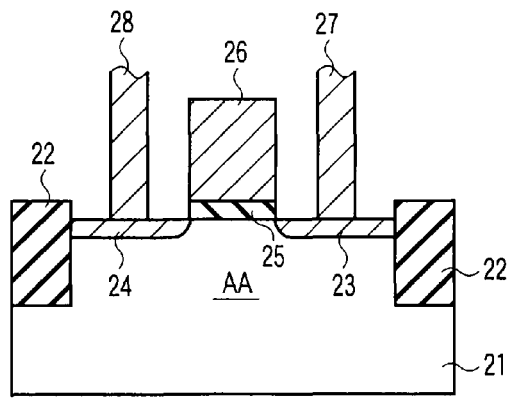
F I G. 4

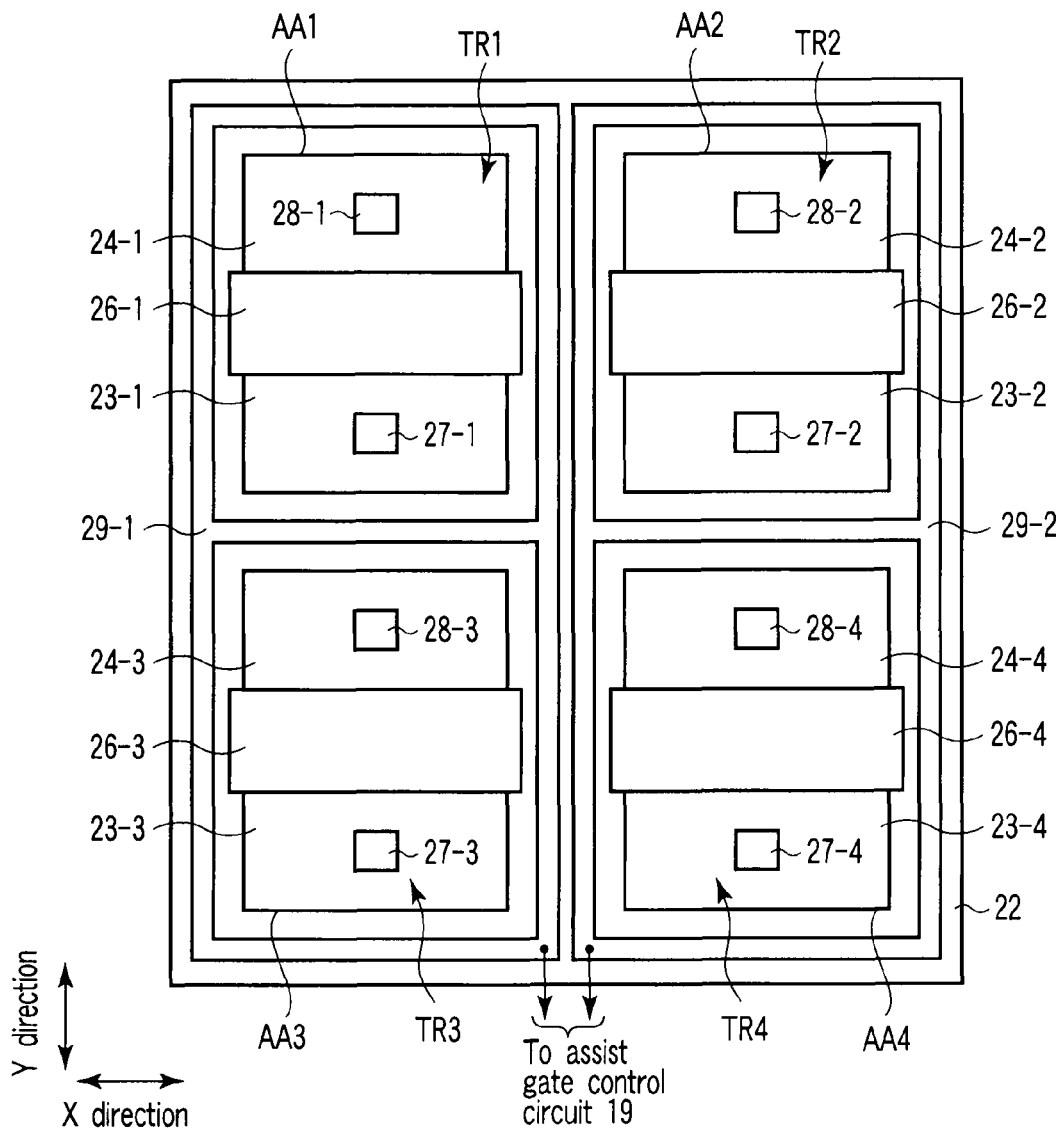
F I G. 9

SEMICONDUCTOR DEVICE

CROSS-REFERENCE TO RELATED APPLICATIONS

This application is based upon and claims the benefit of priority from prior Japanese Patent Application No. 2007-148209, filed Jun. 4, 2007, the entire contents of which are incorporated herein by reference.

BACKGROUND OF THE INVENTION

1. Field of the Invention

The present invention relates to a semiconductor device, and relates, for example, to a semiconductor device including a high-voltage transistor which is used in order to transfer a high voltage to a NAND flash memory.

2. Description of the Related Art

Conventionally, as an example of a semiconductor memory, there is known an EEPROM (Electrically Erasable Programmable Read Only Memory) which is electrically rewritable. In addition, a NAND flash memory, which can be integrated at high density, is known as an example of the EEPROM.

In the case where data is to be written in memory cell transistors, which constitute the NAND flash memory, a high voltage of, e.g. about 20 to 40 V, is needed. Thus, high-voltage transistors, which are used in order to transfer a high voltage to the memory cell transistors, are disposed in a row decoder.

In the meantime, the threshold voltage of the high-voltage transistor that is used for transferring a high voltage rises due to a back bias effect. If the degree of increase of the threshold voltage due to the back bias effect is large, the performance of the high-voltage transistor for transferring a high voltage would decrease.

In addition, if the degree of increase of the threshold voltage of the high-voltage transistor is large, the maximum voltage that is used in the NAND flash memory increases accordingly. As a result, a boost circuit increases in scale, leading to an increase in chip size and in manufacturing cost. Therefore, an improvement in the back bias effect of the high-voltage transistor is important, and, in particular, this is a great challenge for the circuit for high voltage transfer, such as a row decoder.

As related art of this technique, there has been disclosed a technique for preventing field inversion which is a factor of current flow between transistors which neighbor, with an element isolation insulation layer being interposed (Jpn. Pat. Appln. KOKAI Publication No. 2006-59978).

BRIEF SUMMARY OF THE INVENTION

According to a first aspect of the present invention, there is provided a semiconductor device comprising: a semiconductor substrate including a first element region which is surrounded by an element isolation insulation layer; a first transistor including a gate electrode which is provided on the first element region via a gate insulation film, and a source region and a drain region which are provided in the first element region and are spaced apart such that the gate electrode is interposed between the source region and the drain region; a first auxiliary wiring layer and a second auxiliary wiring layer which extend in a channel length direction and are provided on the element isolation insulation layer such that the first transistor is interposed between the first auxiliary wiring layer and the second auxiliary wiring layer; and a control circuit which sets, while the first transistor is in an ON state, the first auxiliary wiring layer and the second auxiliary wiring layer at a first voltage of the same polarity as a gate voltage of the first transistor that is in the ON state.

According to a second aspect of the present invention, there is provided a semiconductor device comprising: a semiconductor substrate including an element region which is surrounded by an element isolation insulation layer; a transistor including a gate electrode which is provided on the element region via a gate insulation film, and a source region and a drain region which are provided in the element region and are spaced apart such that the gate electrode is interposed between the source region and the drain region; an auxiliary wiring layer which is provided on the element isolation insulation layer to surround the transistor; and a control circuit which sets, while the transistor is in an ON state, the auxiliary wiring layer at a first voltage of the same polarity as a gate voltage of the transistor that is in the ON state.

According to a third aspect of the present invention, there is provided a semiconductor device comprising: a semiconductor substrate including an element region which is surrounded by an element isolation insulation layer; a transistor including a gate electrode which is provided on the element region via a gate insulation film, and a source region and a drain region which are provided in the element region and are spaced apart such that the gate electrode is interposed between the source region and the drain region; a first auxiliary wiring layer and a second auxiliary wiring layer which extend in a channel length direction and between which the transistor is interposed, a lower portion of each of the first auxiliary wiring layer and the second auxiliary wiring layer being buried in the element isolation insulation layer; and a control circuit which sets, while the transistor is in an ON state, the first auxiliary wiring layer and the second auxiliary wiring layer at a first voltage of the same polarity as a gate voltage of the transistor that is in the ON state.

BRIEF DESCRIPTION OF THE SEVERAL VIEWS OF THE DRAWING

FIG. 2 is a plan view showing the structure of a single high-voltage transistor TR according to the first embodiment;

FIG. 3 is a cross-sectional view of the high-voltage transistor TR, taken along line III-III in FIG. 2;

FIG. 4 is a cross-sectional view of the high-voltage transistor TR, taken along line IV-IV in FIG. 2;

FIG. 9 is a plan view showing a structure of a plurality of high-voltage transistors TR according to a fifth embodiment of the invention;

DETAILED DESCRIPTION OF THE INVENTION

Figure 1:
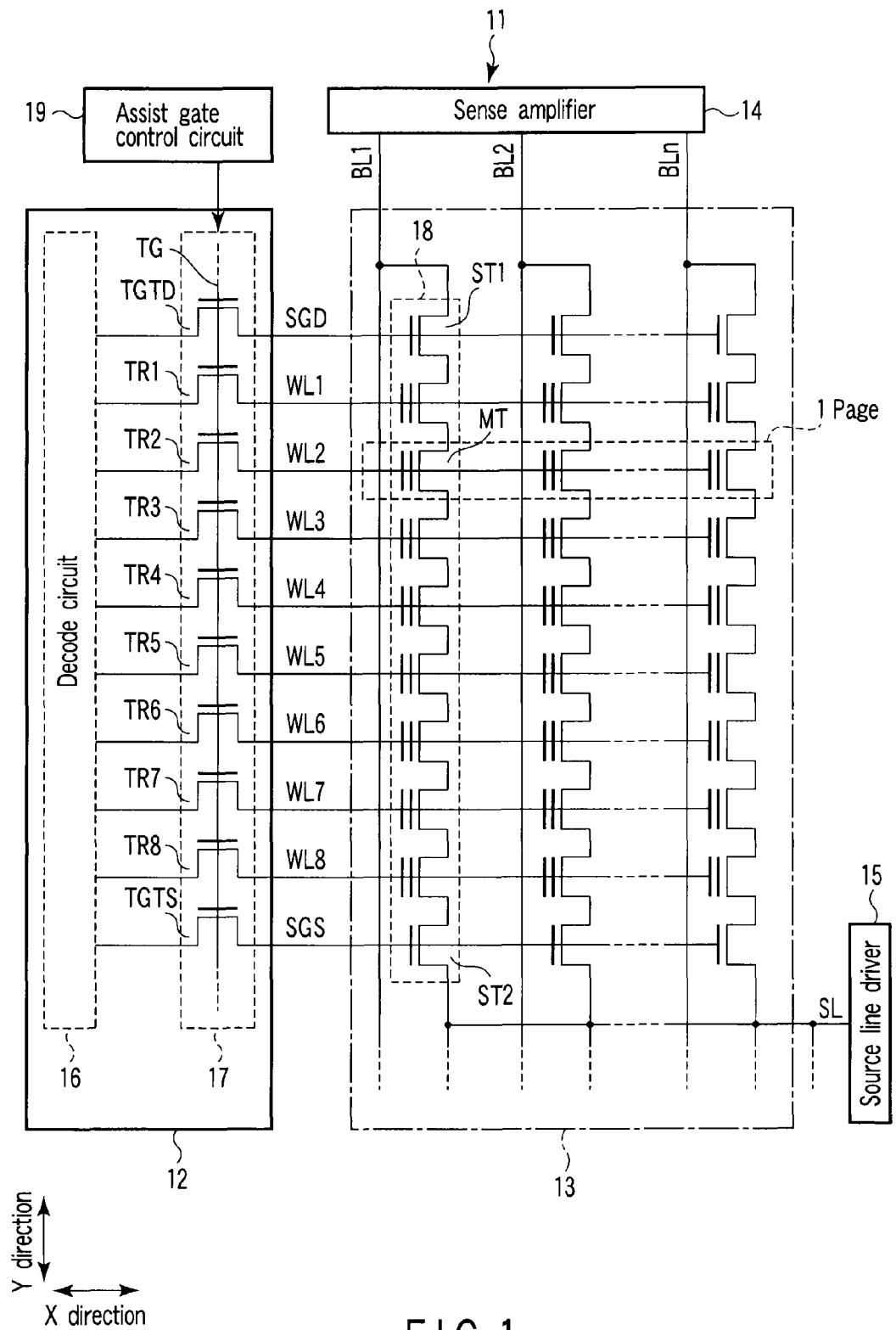
FIG. 1 is a circuit block diagram showing the structure of a NAND flash memory 11 according to a first embodiment of the present invention.

Embodiments of the present invention will now be described with reference to the accompanying drawings. In the description below, structural elements having the same functions and the same structures are denoted by like reference numerals, and an overlapping description is given only where necessary.

First Embodiment

A semiconductor device according to a first embodiment of the present invention is described by taking a NAND flash memory as an example. FIG. 1 is a circuit block diagram showing the structure of a NAND flash memory 11 according to the first embodiment of the invention. The NAND flash memory 11 comprises a row decoder 12, a memory cell array 13, a sense amplifier 14 and a source line driver 15.

The memory cell array 13 comprises a plurality of NAND cell units 18 which are arrayed in a matrix. Each of the NAND cell units 18 comprises a memory cell string which is composed of a plurality of series-connected memory cell transistors MT (in this embodiment, for example, eight memory cell transistors MT), a select transistor ST1 which is connected in series to one end (drain side) of the memory cell string, and a select transistor ST2 which is connected in series to the other end (source side) of the memory cell string.

Each of the memory cell transistors MT is an electrically rewritable memory cell. The memory cell transistor MT has a multilayer gate structure wherein a gate insulation film (tunnel insulation film), a charge accumulation layer (floating gate electrode), an inter-gate insulation film and a control gate electrode are successively stacked on a semiconductor substrate. The eight memory cell transistors MT are connected in series such that neighboring memory cell transistors MT share their source/drain regions. Data in the memory cell transistor MT is rewritten by injecting electrons in the floating gate electrode that is included in the memory cell transistor MT, or by extracting electrons from the floating gate electrode.

The floating gate electrode is provided in association with each of the memory cell transistors MT, and the floating gate electrode is disposed in an island shape on the semiconductor substrate via the gate insulation film. The control gate electrode is provided in a manner to extend in an X direction, and is shared by a plurality of memory cell transistors MT which neighbor in the same row.

The control gate electrode of the memory cell transistor MT corresponds to a word line WL. The gate electrode of the drain-side select transistor ST1 corresponds to a select gate line SGD. The gate electrode of the source-side select transistor ST2 corresponds to a select gate line SGS. The drain of the select transistor ST1 is connected to a bit line BL which extends in a Y direction. The source of the select transistor ST2 is connected to a source line SL which extends in the X direction.

A plurality of bit lines BL1 to BLn are connected to the sense amplifier 14. The sense amplifier 14 amplifies data which is read from the memory cell transistor MT which is selected. The source line SL is connected to the source line driver 15. The source line driver 15 applies to the source line SL a voltage that corresponds to the operation of the memory cell transistor MT.

The row decoder 12 selects one of the word lines WL1 to WL8 on the basis of a row address signal, and further selects the select gate lines SGD and SGS. The row decoder 12 includes a decode circuit 16 and a switch circuit 17. The decode circuit 16 decodes the row address signal and sends the decoded signal to the switch circuit 17. The switch circuit 17 includes transfer gate transistors TGTD and TGTS and a plurality of high-voltage transistors TR (including TR1 to TR8), which have their gates commonly connected to a transfer gate line TG. Each of the transfer gate transistors TGTD and TGTS and high-voltage transistors TR is composed of an N channel MOS (metal oxide semiconductor) transistor.

The drain of the high-voltage transistor TR is connected to the decode circuit 16, and the source thereof is connected to the word line WL. The drain of the transfer gate transistor TGTD is connected to the decode circuit 16 and the source thereof is connected to the select gate line SGD. The drain of the transfer gate transistor TGTS is connected to the decode circuit 16 and the source thereof is connected to the select gate line SGS.

FIG. 2 is a plan view showing the structure of a single high-voltage transistor TR. FIG. 3 is a cross-sectional view of the high-voltage transistor TR, taken along line III-III in FIG. 2. FIG. 4 is a cross-sectional view of the high-voltage transistor TR, taken along line IV-IV in FIG. 2.

A substrate 21 with P-type conductivity is, for instance, a P-type semiconductor substrate, a semiconductor substrate including a P-type well, or an SOI (Silicon On Insulator) including a P-type semiconductor layer. Silicon (Si), for instance, is used for the semiconductor substrate 21.

The semiconductor substrate 21 includes an element isolation insulation layer 22 in a surface region thereof. A surface region of the semiconductor substrate 21, where the element isolation insulation layer 22 is not formed, becomes an element region (active region) AA where an element is to be formed. The element isolation insulation layer 22 is formed of, e.g. an STI (Shallow Trench Isolation). Silicon oxide, for instance, is used for the STI 22. The STI 22 is provided in a manner to surround a single element region AA which is provided in association with a single high-voltage transistor TR.

A source region 23 and a drain region 24 are provided in the element region AA. Each of the source region 23 and the drain region 24 is formed of an n$^+$ diffusion region which is formed by doping n$^+$ type impurity (e.g. phosphorus (P) or arsenic (As)) at high concentration in silicon. The source region 23 is electrically connected to the word line WL via a contact 27. The drain region 24 is electrically connected to the decode circuit 16 via a contact 28.

A gate electrode 26 is provided via a gate insulation film 25 on the element region AA between the source region 23 and the drain region 24. In addition, fringe portions of the gate electrode 26 extend onto the element isolation insulation layer 22. Silicon oxide, for instance, is used for the gate insulation film 25. A conductor, for instance, polycrystalline silicon, is used for the gate electrode 26. In FIG. 2, the channel length (gate length) corresponds to the Y direction, and the channel width (gate width) corresponds to the X direction. The gate electrode 26 is connected to the transfer gate line TG shown in FIG. 1.

Auxiliary wiring layers (assist gates) 29 and 30, which extend in the Y direction, are provided on the element isolation insulation layer 22 on both sides in the X direction of the high-voltage transistor TR in such a manner that each of the auxiliary wiring layers (assist gates) 29 and 30 is spaced apart from the element region AA by a predetermined distance. The length of the assist gate 29, 30 in the Y direction is set to be equal to or greater than the length of the element region AA in the Y direction. A conductor, for example, the same material as the material of the gate electrode 26, is used for the assist gate 29, 30. The assist gates 29 and 30 are electrically connected to an assist gate control circuit 19 shown in FIG. 1. In addition, the paired assist gates 29 and 30 are provided in association with each of the high-voltage transistors TR, and are set at the same voltage by the assist gate control circuit 19.

Next, referring to FIG. 1 and FIG. 2, a description is given of the operation of the high-voltage transistor TR in a case where data is written in the memory cell transistors MT. Data write is executed batchwise in all memory cell transistors MT (one page) which are connected to one word line WL. In the description below, it is assumed, for example, that data is written in the memory cell transistors MT that are connected to the word line WL2.

The transfer gate line TG is rendered inactive (0V). Accordingly, the high-voltage transistor TR2 is turned off. The source region 23 and drain region 24 of the high-voltage transistor TR2 are set at 0V, or in a floating state.

To start with, in order to select the memory cell transistors MT which are connected to the word line WL2, a write voltage Vpgm (e.g. about 25V) is applied from the decode circuit 16 to the drain region 24 of the high-voltage transistor TR2. Further, while the high-voltage transistor TR2 is turned off, the assist gates 29 and 30 of the high-voltage transistor TR2 are set at a ground voltage (0V) or a negative voltage by the assist gate control circuit 19.

At this time, P-type impurity ions at a channel-STI interface decrease, and impurity ions, which act on the channel of the high-voltage transistor TR2, become deficient in the high-voltage transistor TR2. Thereby, contrary to a general narrow channel effect (so-called "reverse narrow channel effect"), the threshold voltage Vth of the high-voltage transistor TR2 decreases as the channel width (gate width) becomes smaller. The reason for this is that the threshold voltage Vth at both end portions in the X direction of the channel of the high-voltage transistor TR2 decreases. Thus, by setting the assist gates 29 and 30 at 0V (or a negative voltage), punch-through leak can be prevented.

Subsequently, the decode circuit 16 applies to the transfer gate line TG a voltage VpgmH (Vpgm+Vth; e.g. about 26V) for transferring a write voltage Vpgm to the word line WL2. The voltage VpgmH is applied to the gate electrode 26 of the high-voltage transistor TR2, and the high-voltage transistor TR2 is turned on. Thereby, the write voltage Vpgm is transferred to the word line WL2.

Further, while the high-voltage transistor TR2 is in the ON state, the assist gates 29 and 30 of the high-voltage transistor TR2 are set at an assist gate voltage Vag, which is a positive voltage, by the assist gate control circuit 19. Preferably, the assist gate voltage Vag is set at about a high voltage (about the write voltage Vpgm) that is applied to the gate electrode 26 of the high-voltage transistor TR.

At this time, since the back bias characteristics of the high-voltage transistor TR2 are improved, the threshold voltage Vth of the high-voltage transistor TR2 lowers. Specifically, when the high voltage is transferred, if the assist gate voltage Vag is increased up to about a voltage that is equal to the voltage at the gate electrode 26 of the high-voltage transistor TR2, the assist gate voltage Vag acts on the channel that neighbors the element isolation insulation layer 22 of the high-voltage transistor TR2, and accordingly a gate insulation film capacitance Cox of the high-voltage transistor TR2 increases. Since the threshold voltage Vth is inversely proportional to the gate insulation film capacitance Cox, the threshold voltage Vth decreases. As a result, the performance of the high-voltage transistor TR2 for transferring the high voltage is enhanced, and thus the voltage VpgmH can be lowered.

After the transfer of the high voltage, the transfer gate line TG is rendered inactive (0V) by the decode circuit 16. Thereby, the high-voltage transistor TR2 is turned off. In addition, while the high-voltage transistor TR2 is in the OFF state, the assist gates 29 and 30 of the high-voltage transistor TR2 are set at a ground voltage (0V) or a negative voltage by the assist gate control circuit 19.

In the meantime, the assist gates 29 and 30 are formed in the same fabrication step as the gate electrode 26 of the high-voltage transistor TR. Specifically, after the element isolation insulation layer 22 is formed, a gate insulation film and a conductive layer of the same material as the gate electrode 26 are deposited on the semiconductor substrate 21. Then, the conductive layer is patterned by lithography or RIE (Reactive Ion Etching), thereby forming the assist gates 29 and 30 and the gate electrode 26 at the same time. In this manufacturing method, the assist gates 29 and 30 can be formed without an additional fabrication step.

As has been described above in detail, in the present embodiment, the assist gate voltage Vag, which is applied to the assist gates 29 and 30, is set at a ground voltage (0V) or a negative voltage by the assist gate control circuit 19 in the case where the high-voltage transistor TR is in the OFF state, and is set at about a high voltage (about the write voltage Vpgm) that is applied to the gate electrode 26 in the case where the high-voltage transistor TR is in the ON state.

According to the present embodiment, in the case where the high-voltage transistor TR is in the OFF state, since the threshold voltage Vth at both end portions in the X direction of the channel of the high-voltage transistor TR2 lowers, punch-through leak can be prevented. Thereby, since excess power consumption due to punch-through leak can be reduced, the reliability of the NAND flash memory 11 can be improved.

In the case where the high-voltage transistor TR is in the ON state, the back bias characteristics are improved, and the threshold voltage Vth of the high-voltage transistor TR lowers. Thereby, since the performance of the high-voltage transistor TR2 for transferring the high voltage is improved, the maximum voltage that is necessary for transferring the high voltage can be lowered.

Since the maximum voltage that is handled by the decode circuit 16 can be lowered, it becomes possible to achieve microfabrication of the boost circuit for generating the maximum voltage and microfabrication of the transistor that handles the maximum voltage. As a result, microfabrication of the decode circuit 16 and switch circuit 17 can be achieved, and accordingly the circuit area of the NAND flash memory 11 can be reduced.

In the present embodiment, the N-channel MOS transistor is exemplified as the high-voltage transistor TR. However, the high-voltage transistor TR is not limited to the N-channel MOS transistor, and it may be composed of a P-channel MOS transistor. In this case, this embodiment can similarly be practiced by reversing the conductivity type and the polarity of voltage.

Second Embodiment

In a second embodiment of the present invention, auxiliary wiring layers (assist gates) are provided in a manner to extend in the Y direction in association with each of the high-voltage transistors TR, and a shield wiring layer for preventing punch-through leak is provided in a manner to extend in the X direction between the high-voltage transistors that neighbor in the Y direction.

Figure 5:
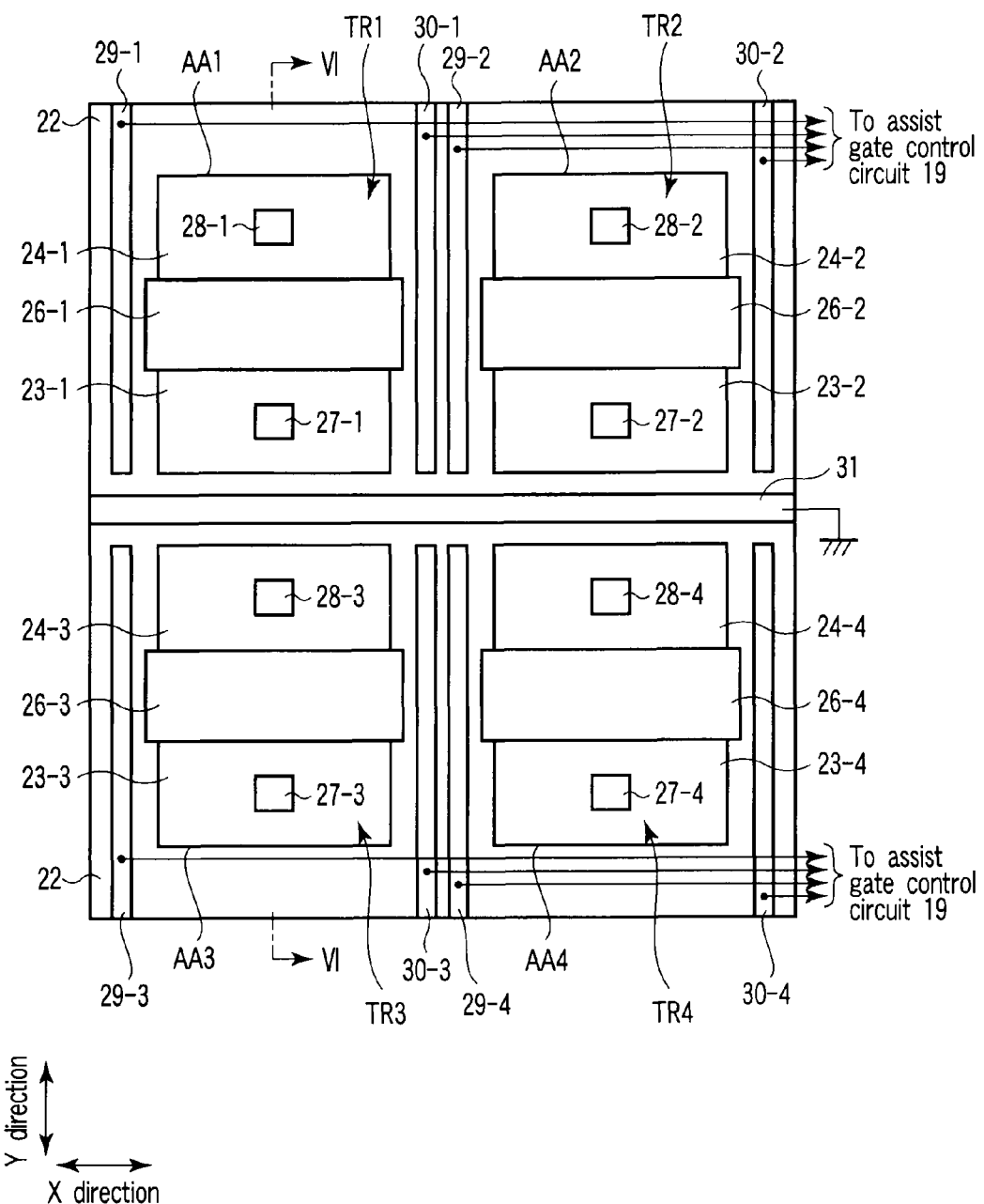
FIG. 5 is a plan view showing the structure of a plurality of high-voltage transistors TR according to a second embodiment of the invention.
Figure 6:
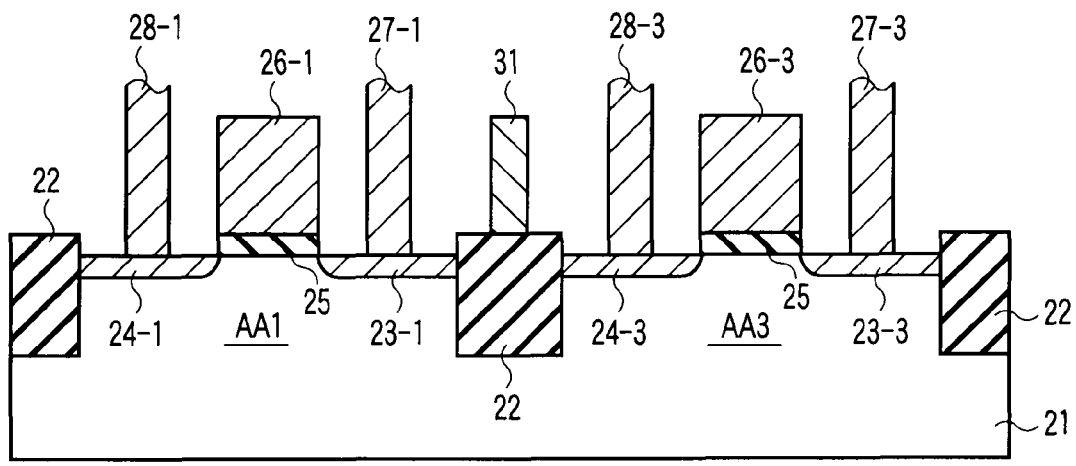
FIG. 6 is a cross-sectional view of high-voltage transistors TR1 and TR3, taken along line VI-VI in FIG. 5.

FIG. 5 is a plan view showing the structure of a plurality of high-voltage transistors TR according to the second embodiment of the invention. FIG. 5 shows four high-voltage transistors TR1 to TR4 by way of example. FIG. 6 is a cross-sectional view of the high-voltage transistors TR1 and TR3, taken along line VI-VI in FIG. 5.

A surface region of a P-type semiconductor substrate 21 is provided with four element regions AA1 to AA4 and an element isolation insulation layer 22 which isolates the four element regions AA1 to AA4. Specifically, the element regions AA neighbor each other via the element isolation insulation layer 22. In addition, each of the four element regions AA1 to AA4 is surrounded by the element isolation insulation layer 22. High-voltage transistors TR1 to TR4 are provided on the element regions AA1 to AA4, respectively.

The high-voltage transistor TR1 includes a gate electrode 26-1, a source region 23-1 and a drain region 24-1. The high-voltage transistor TR2, which neighbors the high-voltage transistor TR1 in the X direction via the element isolation insulation layer 22, includes a gate electrode 26-2, a source region 23-2 and a drain region 24-2. The high-voltage transistor TR3, which neighbors the high-voltage transistor TR1 in the Y direction via the element isolation insulation layer 22, includes a gate electrode 26-3, a source region 23-3 and a drain region 24-3. The high-voltage transistor TR4, which neighbors the high-voltage transistor TR3 in the X direction and neighbors the high-voltage transistor TR2 in the Y direction via the element isolation insulation layer 22, includes a gate electrode 26-4, a source region 23-4 and a drain region 24-4.

Assist gates 29-1 and 30-1, which extend in the Y direction, are provided on the element isolation insulation layer 22 on both sides in the X direction of the high-voltage transistor TR1 in such a manner that each of the assist gates 29-1 and 30-1 is spaced apart from the element region AA1 by a predetermined distance. Similarly, assist gates 29-2, 30-2, 29-3, 30-3, 29-4 and 30-4 corresponding to the other high-voltage transistors TR2 to TR4 are provided on the element isolation insulation layer 22.

The assist gates 29-1 to 29-4 and 30-1 to 30-4 are electrically connected to the assist gate control circuit 19 shown in FIG. 1. The paired assist gates 29 and 30 are provided in association with each of the high-voltage transistors TR, and are set at the same assist gate voltage Vag by the assist gate control circuit 19.

A shield wiring layer 31, which extends in the X direction, is provided on the element isolation insulation layer 22 between the high-voltage transistors TR1 and TR3 and between the high-voltage transistors TR2 and TR4. The length of the shield wiring layer 31 in the X direction is set to be equal to or greater than each element region AA. The shield wiring layer 31 is fixed at a ground voltage (0V) or a negative voltage. A conductor, for example, the same material as the material of the gate electrode 26, is used for the shield wiring layer 31.

Next, referring to FIG. 1 and FIG. 5, a description is given of the operation of the high-voltage transistor TR in a case where data is written in the memory cell transistors MT. In the description below, it is assumed, for example, that data is written in the memory cell transistors MT that are connected to the word line WL3.

The transfer gate line TG is rendered inactive (0V). Accordingly, the high-voltage transistors TR1 to TR4 are turned off. The source and drain of the high-voltage transistor, TR1 to TR4, are set at 0V, or in a floating state.

To start with, in order to select the memory cell transistors MT which are connected to the word line WL3, a write voltage Vpgm is applied from the decode circuit 16 to the drain region 24-3 of the high-voltage transistor TR3. On the other hand, since the word lines WL1, WL2 and WL4 are not selected, a high voltage is not applied to the drain regions of the high-voltage transistors TR1, TR2 and TR4, and 0V is applied to these drain regions.

Further, while the high-voltage transistors TR1 to TR4 are turned off, the assist gates 29-1 to 29-4 and 30-1 to 30-4 are set at 0V (or a negative voltage) by the assist gate control circuit 19.

In the case of this bias relationship, a high electric field occurs between the drain regions 24-3 and 24-4. However, since the assist gates 30-3 and 29-4 are set at 0V (or a negative voltage), punch-through leak between the drain regions 24-3 and 24-4 can be prevented. In addition, in the high-voltage transistor TR3, punch-through leak can be prevented, as described in connection with the first embodiment.

In addition, a high electric field occurs between the source region 23-1 and the drain region 24-3. However, since the shield wiring layer 31 that is set at 0V (or a negative voltage) is disposed between the high-voltage transistors TR1 and TR3 which neighbor in the Y direction, punch-through leak between the source region 23-1 and the drain region 24-3 can be prevented.

Subsequently, a positive intermediate voltage Vpass (<Vpgm) is applied from the decode circuit 16 to the drain regions of the high-voltage transistors TR1, TR2 and TR4 corresponding to the non-selected word lines WL1, WL2 and WL4. Further, the decode circuit 16 applies a voltage VpgmH to the transfer gate line TG. Thus, the high-voltage transistors TR1 to TR4 are turned on. Thereby, the write voltage Vpgm is transferred to the word line WL3, and the intermediate voltage Vpass is transferred to the word lines WL1, WL2 and WL4.

Further, while the high-voltage transistors TR1 to TR4 are in the ON state, the assist gates 29-1 to 29-4 and 30-1 to 30-4 are set at a positive assist gate voltage Vag by the assist gate control circuit 19. Preferably, the assist gate voltage Vag is set at about a high voltage (about the write voltage Vpgm) that is applied to the gate electrode 26 of the high-voltage transistor TR.

At this time, like the first embodiment, since the back bias characteristics of the high-voltage transistors TR1 to TR4 are improved, the threshold voltage Vth of the high-voltage transistor, TR1 to TR4, lowers. Thereby, since the performance of the high-voltage transistor, TR1 to TR4, for transferring the high voltage is enhanced, the voltage VpgmH can be lowered.

As has been described above in detail, according to the present embodiment, since the shield wiring layer 31, which is set at 0V (or a negative voltage), is disposed between the high-voltage transistors TR that neighbor in the Y direction, punch-through leak between the high-voltage transistors TR1 and TR3 can be prevented. Thereby, since excess power consumption due to punch-through leak can be reduced, the reliability of the NAND flash memory 11 can be improved.

In the case where the high-voltage transistor TR is in the OFF state, the assist gates are set at 0V (or a negative voltage). Thereby, since the threshold voltage Vth at both end portions in the X direction of the channel of the high-voltage transistor TR decreases, punch-through leak of the high-voltage transistor TR can be prevented. Further, punch-through leak between the high-voltage transistors TR that neighbor in the X direction can be prevented.

In the case where the high-voltage transistor TR is in the ON state, the assist gates are set at about a high voltage (about the write voltage Vpgm) that is applied to the gate electrode 26. Thereby, the back bias characteristics are improved, and the threshold voltage Vth of the high-voltage transistor TR lowers. As a result, since the performance of the high-voltage transistor TR for transferring the high voltage is improved, the maximum voltage that is necessary for transferring the high voltage can be lowered and accordingly it becomes possible to achieve microfabrication of the decode circuit 16 and the switch circuit 17.

Besides, since punch-through leak can be prevented by the assist gates and the shield wiring layer, the insulation properties between the high-voltage transistors TR are improved. Hence, there is no need to increase the width of the element isolation insulation layer 22 between the high-voltage transistors TR that neighbor in the X direction and Y direction. Therefore, the area of the element isolation insulation layer 22 in the X direction and Y direction can be reduced, and microfabrication can advantageously be achieved.

Third Embodiment

Figure 7:
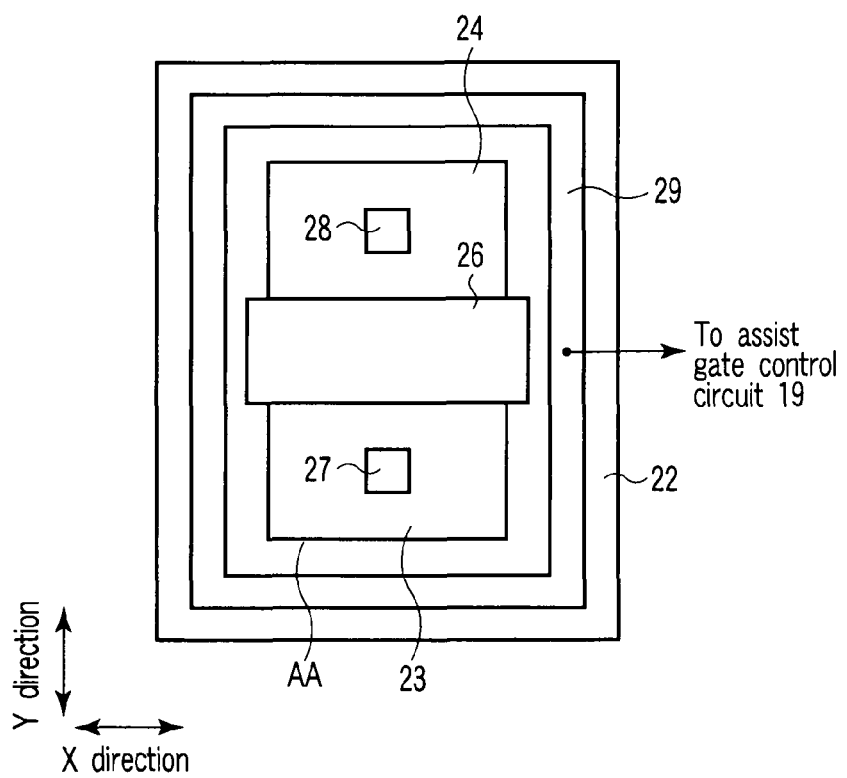
FIG. 7 is a plan view showing the structure of a single high-voltage transistor TR according to a third embodiment of the invention.

In a third embodiment of the present invention, an auxiliary wiring layer (assist gate) is provided on an element isolation insulation layer, and this assist gate is configured so as to surround a single high-voltage transistor. FIG. 7 is a plan view showing the structure of a single high-voltage transistor TR according to the third embodiment of the invention.

A surface region of a P-type semiconductor substrate 21 is provided with an element region AA and an element isolation insulation layer 22 which surrounds the element region AA. Like the first embodiment, a single high-voltage transistor TR is provided on the single element region AA.

An assist gate 29 is provided on the element isolation insulation layer 22 in a manner to surround the high-voltage transistor TR with a predetermined distance from the element region AA. The assist gate 29 is electrically connected to the assist gate control circuit 19 shown in FIG. 1.

The assist gate 29 of the present embodiment is configured such that the assist gates 29 and 30 shown in the first embodiment are short-circuited. Thereby, the number of contacts for electrically connecting the assist gate 29 and the assist gate control circuit 19 can be reduced to one, and accordingly the number of wires for electrically connecting the assist gate 29 and the assist gate control circuit 19 can be reduced.

Since the assist gate 29 is controlled by the same voltage by the assist gate control circuit 19, a variance in voltage can be prevented. Thereby, the characteristics of the high-voltage transistor TR can exactly be controlled. The other advantageous effects of the third embodiment are the same as those of the first embodiment.

Fourth Embodiment

Figure 8:
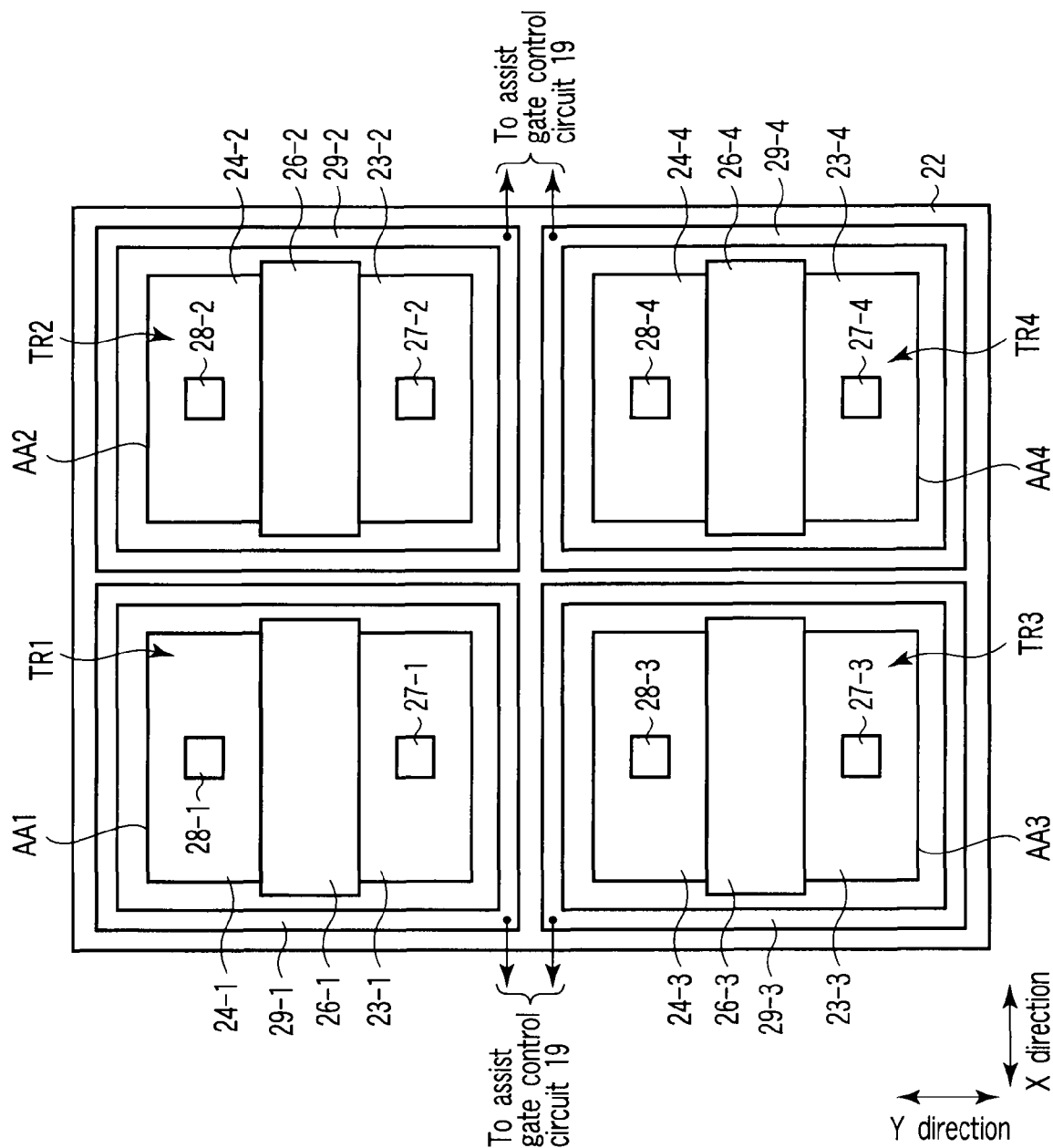
FIG. 8 is a plan view showing the structure of a plurality of high-voltage transistors TR according to a fourth embodiment of the invention.

A fourth embodiment of the present invention relates to a structure example in which auxiliary wiring layers (assist gates) are provided in association with a plurality of high-voltage transistors having different bias states, respectively. FIG. 8 is a plan view showing the structure of a plurality of high-voltage transistors TR according to the fourth embodiment of the invention. FIG. 8 shows four high-voltage transistors TR1 to TR4.

Assist gates 29-1 to 29-4 are provided on the element isolation insulation layer 22 in a manner to surround the high-voltage transistors TR1 to TR4 with a predetermined distance from the element regions AA. The assist gates 29-1 to 29-4 are electrically connected to the assist gate control circuit 19 shown in FIG. 1.

Next, referring to FIG. 1 and FIG. 8, a description is given of the operation of the high-voltage transistors TR in a case where data is written in the memory cell transistors MT. In the description below, it is assumed, for example, that data is written in the memory cell transistors MT that are connected to the word line WL3.

The transfer gate line TG is rendered inactive (0V). Accordingly, the high-voltage transistors TR1 to TR4 are turned off. The source and drain of the high-voltage transistor, TR1 to TR4, are set at 0V, or in a floating state.

To start with, in order to select the memory cell transistors MT which are connected to the word line WL3, a write voltage Vpgm is applied from the decode circuit 16 to the drain region 24-3 of the high-voltage transistor TR3. On the other hand, since the word lines WL1, WL2 and WL4 are not selected, a high voltage is not applied to the drain regions of the high-voltage transistors TR1, TR2 and TR4, and 0V is applied to these drain regions.

Further, while the high-voltage transistors TR1 to TR4 are in the OFF state, the assist gates 29-1 to 29-4 are set at 0V (or a negative voltage) by the assist gate control circuit 19.

In the case of this bias relationship, a high electric field occurs between the drain regions 24-3 and 24-4. However, since the assist gates 29-3 and 29-4 are set at 0V (or a negative voltage), punch-through leak between the drain regions 24-3 and 24-4 can be prevented. Similarly, a high electric field occurs between the source region 23-1 and the drain region 24-3. However, since the assist gates 29-1 and 29-3 are set at 0V (or a negative voltage), punch-through leak between the source region 23-1 and the drain region 24-3 can be prevented.

Subsequently, a positive intermediate voltage Vpass (<Vpgm) is applied by the decode circuit 16 to the drain regions of the high-voltage transistors TR1, TR2 and TR4 corresponding to the non-selected word lines WL1, WL2 and WL4. Further, the decode circuit 16 applies a voltage VpgmH to the transfer gate line TG. Thus, the high-voltage transistors TR1 to TR4 are turned on. Thereby, the write voltage Vpgm is transferred to the word line WL3, and the intermediate voltage Vpass is transferred to the word lines WL1, WL2 and WL4.

Further, while the high-voltage transistors TR1 to TR4 are in the ON state, the assist gates 29-1 to 29-4 are set at a positive assist gate voltage Vag by the assist gate control circuit 19. Preferably, the assist gate voltage Vag is set at about a high voltage (about the write voltage Vpgm) that is applied to the gate electrode 26 of the high-voltage transistor TR.

At this time, like the first embodiment, since the back bias characteristics of the high-voltage transistors TRI to TR4 are improved, the threshold voltage Vth of the high-voltage transistor, TR1 to TR4, lowers. Thereby, since the performance of the high-voltage transistor, TR1 to TR4, for transferring the high voltage is enhanced, the voltage VpgmH can be lowered.

Even in the case where the high-voltage transistors TR are configured as described above, the same advantageous effects as in the second and third embodiments can be obtained.

Fifth Embodiment

In a fifth embodiment of the present invention, those assist gate portions of auxiliary wiring layers (assist gates) provided in association with neighboring high-voltage transistors, which are located between neighboring high-voltage transistors, are configured to be shared. FIG. 9 is a plan view showing a structure of a plurality of high-voltage transistors TR according to the fifth embodiment of the invention.

An assist gate 29-1 is provided on an element isolation insulation layer 22 in a manner to surround high-voltage transistors TR1 and TR3. Specifically, an assist gate surrounding the high-voltage transistor TR1 and an assist gate surrounding the high-voltage transistor TR3 share an assist gate portion which is located between the high-voltage transistors TR1 and TR3. In this manner, the assist gate surrounding the high-voltage transistor TR1 and the assist gate surrounding the high-voltage transistor TR3 are electrically connected, and a single assist gate 29-1 is formed.

Similarly, an assist gate 29-2 is provided on the element isolation insulation layer 22 in a manner to surround high-voltage transistors TR2 and TR4. The assist gate 29-1 and the assist gate 29-2 are electrically connected to the assist gate control circuit 19.

Even in the case where the assist gates are structured as described above, punch-through leak can be prevented, and the threshold voltage Vth of the high-voltage transistors TR at the ON time can be lowered.

In addition, since the assist gates corresponding to the high-voltage transistors TR which neighbor in the Y direction are electrically connected, the number of wires for electrically connecting the assist gates and the assist gate control circuit 19 can be reduced.

Figure 10:
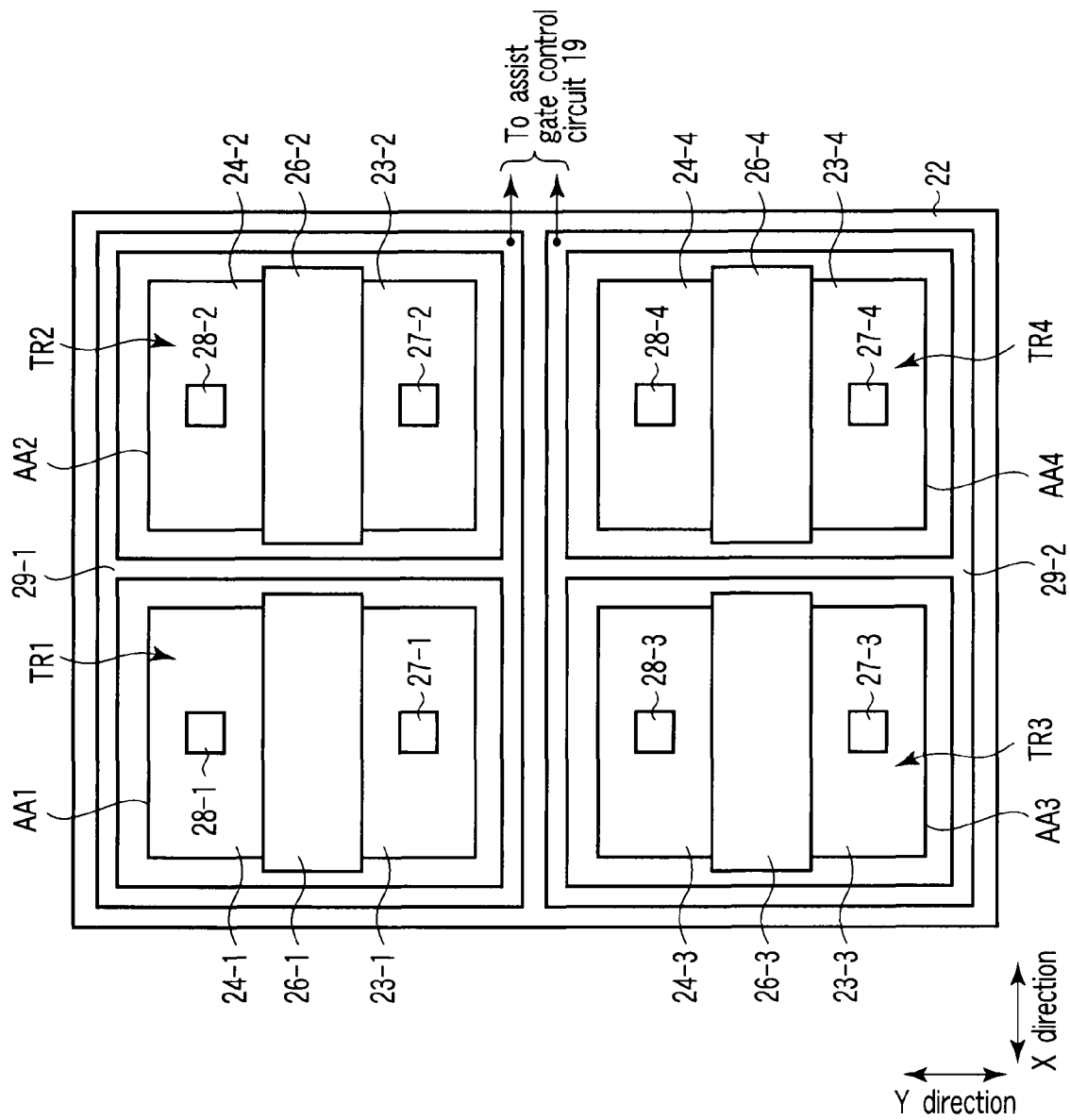
FIG. 10 is a plan view showing another structure of the plural high-voltage transistors TR according to the fifth embodiment.

Alternatively, assist gates corresponding to the high-voltage transistors TR neighboring in the X direction may be electrically connected. FIG. 10 is a plan view showing another structure of the plural high-voltage transistors TR according to the fifth embodiment of the invention.

An assist gate 29-1 is provided on the element isolation insulation layer 22 in a manner to surround the high-voltage transistors TR1 and TR2. Specifically, an assist gate surrounding the high-voltage transistor TR1 and an assist gate surrounding the high-voltage transistor TR2 share an assist gate portion which is located between the high-voltage transistors TR1 and TR2. In this manner, the assist gate surrounding the high-voltage transistor TR1 and the assist gate surrounding the high-voltage transistor TR2 are electrically connected, and a single assist gate 29-1 is formed.

Even in the case where the assist gates are structured in this fashion, the same advantageous effects as described above can be obtained. In the present embodiment, it is preferable that two high-voltage transistors, which perform the same operation, be chosen as the two high-voltage transistors which are surrounded by a single assist gate. However, even in the case where the two high-voltage transistors do not perform the same operation, it is possible to obtain the advantageous effect that the threshold voltage Vth of each high-voltage transistor TR can be lowered.

Sixth Embodiment

In a sixth embodiment of the present invention, lower portions of assist gates are buried in an element isolation insulation layer, and thereby the controllability at the time of setting the voltage of the element isolation insulation layer by the assist gates can be improved.

Figure 11:
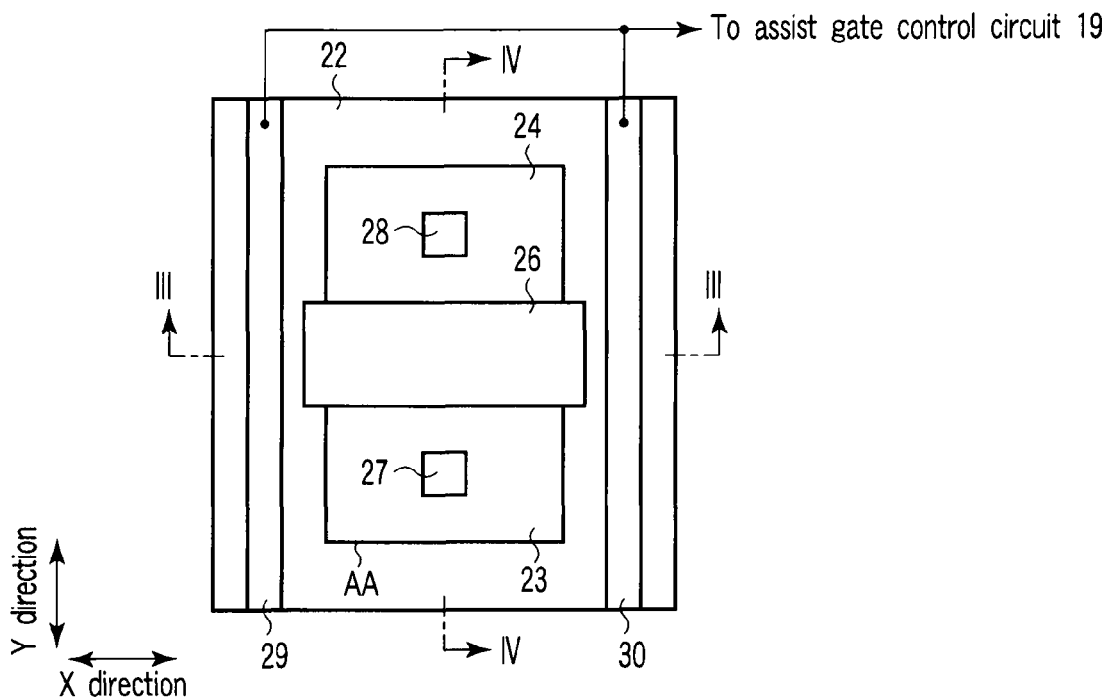
FIG. 11 is a plan view showing the structure of a single high-voltage transistor TR according to a sixth embodiment of the invention.
Figure 12:
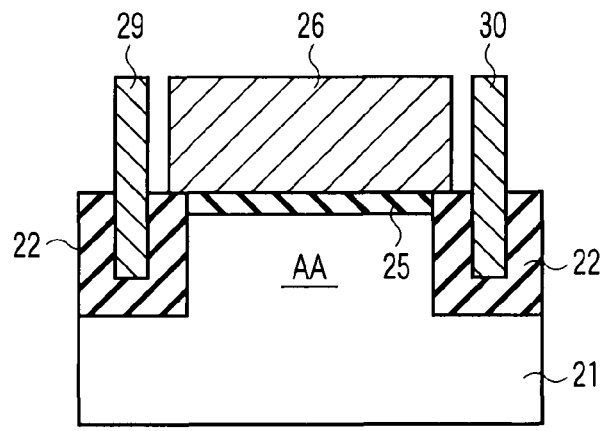
FIG. 12 is a cross-sectional view of the high-voltage transistor TR, taken along line III-III in FIG. 11.

FIG. 11 is a plan view showing the structure of a single high-voltage transistor TR according to the sixth embodiment of the invention. FIG. 12 is a cross-sectional view of the high-voltage transistor TR, taken along line III-III in FIG. 11. A cross-sectional view of the high-voltage transistor TR, taken along line IV-IV in FIG. 11, is the same as FIG. 4 relating to the first embodiment.

Assist gates 29 and 30, which extend in the Y direction, are provided on the element isolation insulation layer 22 on both sides in the X direction of the high-voltage transistor TR in such a manner that each of the assist gates 29 and 30 is spaced apart from the element region AA by a predetermined distance. The length of the assist gate 29, 30 in the Y direction is set to be equal to or greater than the length of the element region AA in the Y direction. Further, as shown in FIG. 12, a lower portion of the assist gate 29 is buried in the element isolation insulation layer 22. An upper portion of the assist gate 29 projects from the element isolation insulation layer 22. The assist gate 30 has the same structure as the assist gate 29.

By configuring the high-voltage transistor TR in this manner, the controllability of the voltage of the element isolation insulation layer 22 can be improved at the time of setting the voltage of the element isolation insulation layer 22 by the assist gates 29 and 30. The other advantageous effects of the present embodiment are the same as those of the first embodiment.

The structure of the assist gate shown in the sixth embodiment is also applicable to the first to fifth embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate including a first element region which is surrounded by an element isolation insulation layer;
    a first transistor including a gate electrode which is provided on the first element region via a gate insulation film, and a source region and a drain region which are provided in the first element region and are spaced apart such that the gate electrode is interposed between the source region and the drain region;
    a first auxiliary wiring layer and a second auxiliary wiring layer which extend in a channel length direction and are provided on the element isolation insulation layer such that the first transistor is interposed between the first auxiliary wiring layer and the second auxiliary wiring layer; and
    a control circuit which sets, while the first transistor is in an ON state, the first auxiliary wiring layer and the second auxiliary wiring layer at a first voltage of the same polarity as a gate voltage of the first transistor that is in the ON state.

2. The device according to claim 1, wherein each of the first auxiliary wiring layer and the second auxiliary wiring layer has a length in the channel length direction, which is equal to or greater than a length of the first element region in the channel length direction.

3. The device according to claim 1, wherein the first voltage is equal to the gate voltage of the first transistor that is in the ON state.

4. The device according to claim 1, wherein the control circuit sets, while the first transistor is in an OFF state, the first auxiliary wiring layer and the second auxiliary wiring layer at a second voltage of a polarity which is opposite to said polarity.

5. The device according to claim 1, further comprising:
a second element region which is provided in the semiconductor substrate and neighbors the first element region in the channel length direction, with an element isolation insulation layer being interposed;
a second transistor which is provided in the second element region; and
a shield wiring layer which is provided on the element isolation insulation layer between the first transistor and the second transistor, extends in a channel width direction, and is fixed at a second voltage of a polarity which is opposite to said polarity.

6. The device according to claim 5, wherein the shield wiring layer has a length in the channel width direction, which is equal to or greater than a length of the first element region in the channel width direction.

7. The device according to claim 1, further comprising:
an electrically rewritable memory cell; and
a word line which is electrically connected to a gate electrode of the memory cell,
wherein the source region of the first transistor is electrically connected to the word line.

8. The device according to claim 7, further comprising a decode circuit which supplies a write voltage for the memory cell to the drain region of the first transistor.

9. The device according to claim 7, wherein the memory cell has a multilayer gate structure in which a tunnel insulation film, a charge accumulation layer, an inter-gate insulation film and the gate electrode are successively stacked.

* * * * *